United States Patent [19]

Itoh et al.

[11] Patent Number: 5,360,860
[45] Date of Patent: Nov. 1, 1994

[54] WATER-SOLUBLE RESIN EMULSION AND PROCESS FOR PREPARATION THEREOF

[75] Inventors: Hiroshi Itoh; Naoki Isobe; Tadashi Asazuma, all of Utsunomiya, Japan

[73] Assignee: Oji Kako Co., Ltd., Tokyo, Japan

[21] Appl. No.: 908,516

[22] Filed: Jun. 26, 1992

Related U.S. Application Data

[63] Continuation of Ser. No. 661,497, Feb. 26, 1991, abandoned.

[30] Foreign Application Priority Data

Feb. 28, 1990 [JP] Japan ................................. 2-45751

[51] Int. Cl.⁵ ............................................ C08F 2/16
[52] U.S. Cl. ................................. 524/460; 524/457; 524/458; 524/459
[58] Field of Search ............... 524/457, 458, 459, 460

[56] References Cited

U.S. PATENT DOCUMENTS

| | | | |
|---|---|---|---|
| 3,010,929 | 11/1961 | Jones | 524/459 X |
| 3,668,165 | 6/1972 | Bergmeister et al. | 524/459 |
| 4,139,509 | 2/1979 | Matsunaga et al. | 524/459 X |
| 4,394,479 | 7/1983 | Serlin | 524/459 |
| 4,528,315 | 7/1985 | Eck et al. | 524/458 |
| 4,542,181 | 9/1985 | Schappiser et al. | 524/458 X |

FOREIGN PATENT DOCUMENTS

0320594A2  6/1989  European Pat. Off. .

OTHER PUBLICATIONS

Japanese Examined Patent Publication 63-50344.
Japanese Examined Patent Publication 44-25794.
Japanese Examined Patent Publication 43-16293.
10 Polymer Chemistry, 108 (1953).

*Primary Examiner*—Judy M. Reddick
*Attorney, Agent, or Firm*—Leydig, Voit, Mayer, Ltd.

[57] ABSTRACT

A water-soluble resin emulsion comprising at least two incompatible water-soluble polymers, wherein said incompatible water-soluble polymers are stably compatibilized with each other by emulsion-polymerizing a monomer having a reactive unsaturated group in the presence of said incompatible water-soluble polymers as the protecting colloid. The emulsion is useful for a top-coating, prime-coating, material for a synthetic leather, photosensitive material for the preparation of a color filter, material for silver salt photography, and photosensitive material for screen printing.

8 Claims, No Drawings

WATER-SOLUBLE RESIN EMULSION AND PROCESS FOR PREPARATION THEREOF

This is a continuation of copending application Ser. No. 661,497 filed on Feb. 26, 1991, now abandoned.

BACKGROUND OF THE INVENTION

(1) Field of the Invention

The present invention relates to a water-soluble resin emulsion in which water-soluble polymers which are incompatible with each other are made stably compatible, and a process for the preparation of this emulsion.

The water-soluble resin emulsion of the present invention has a combination of the characteristics of water-soluble polymers used together as the protecting colloid, and therefore, can manifest characteristic performances not found in known materials.

(2) Description of the Related Art

For example, gelatin has heretofore been used as a photosensitive material for the production of a color filter, but an aqueous solution of gelatin is inherently defective in that the coating property is poor and it is difficult to uniformly coat the aqueous solution. Gelatin is also used as a material for the silver salt photography, but when gelatin alone is used, the mechanical strength is too low, and especially during the developing treatment or the like, scratches are easily formed in the wet state. Nevertheless, when gelatin is used in the form of a water-soluble emulsion containing gelatin and saponified polyvinyl acetate, a photosensitive material for the preparation of a color filter, a material for silver salt photography and a photosensitive material for screen printing, which have an excellent coating property and mechanical strength, can be obtained.

Furthermore, by rendering water-soluble polymers, the combined use of which is difficult because of a poor compatibility therebetween, compatible with each other, an excellent topcoating, an excellent prime-coating, an excellent material for a synthetic leather can be obtained.

Nevertheless, the conventional polymer-modifying techniques for compatibilizing incompatible water-soluble polymers are defective in that a complicated recipe is necessary and the kinds of water-soluble polymers that can be compatibilized are considerably limited. Accordingly, it is difficult to stably compatibilize desired incompatible water-soluble polymers and obtain a material having a combination of the characteristics of both of the water-soluble polymers.

SUMMARY OF THE INVENTION

Therefore, a primary object of the present invention is to solve the foregoing problems of the conventional techniques and provide a water-soluble resin emulsion formed by stably compatibilizing at least two incompatible water-soluble polymers and a process for the preparation of this water-soluble resin emulsion.

In accordance with one aspect of the present invention, this object can be attained by a water-soluble resin emulsion formed by stably compatibilizing at least two incompatible water-soluble polymers by emulsion-polymerizing a monomer having a reactive unsaturated group in the presence of the incompatible water-soluble polymers as the protecting colloid.

In accordance with another aspect of the present invention, there is provided a process for the preparation of a water-soluble emulsion, which comprises emulsion-polymerizing a monomer having a reactive unsaturated monomer in the presence of at least two incompatible water-soluble polymers as the protecting colloid.

DESCRIPTION OF THE PREFERRED EMBODIMENT

Water-soluble resin emulsions formed by using saponified polyvinyl acetate or gelatin as the protecting colloid are disclosed in Polymer Chemistry, 10, page 108 (1953), Japanese Examined Patent Publication No. 43-16293 and Japanese Examined Patent Publication No. 44-25794. The present inventors found that if an emulsion polymerization is carried out by using a polymer mixture of saponified polyvinyl acetate and gelatin, which are incompatible, as a protecting colloid according to customary procedures, the incompatible polymers can be compatibilized. The present inventors made further investigations based on this finding, and as a result, completed the present invention.

As the combination of incompatible water-soluble polymers that can be used as the protecting colloid in the present invention, there can be mentioned not only the above polymer mixture of saponified polyvinyl acetate and gelatin, but also combinations of saponified polyvinyl acetate/dextrin, saponified polyvinyl acetate/British gum, saponified polyvinyl acetate/oxidized starch, saponified polyvinyl acetate/acetylated starch, saponified polyvinyl acetate/etherified starch, saponified polyvinyl acetate/soluble starch, saponified polyvinyl acetate/tragacanth gum, saponified polyvinyl acetate/gum arabic, saponified polyvinyl acetate/sodium polyacrylate, saponified polyvinyl acetate/casein, gelatin/polyacrylamide, gelatin/polyacrylic acid, gelatin/dextran, gelatin/agar, gelatin/agarose, gelatin/sodium alginate, gelatin/methyl cellulose, gelatin/-carrageenan, gelatin/pectin, water-soluble nylon/gelatin, water-soluble nylon/methyl cellulose, water-soluble nylon/hydroxyethyl cellulose, water-soluble nylon/carboxymethyl cellulose, water-soluble nylon/sodium starch phosphate, water-soluble nylon/polyvinyl pyrrolidone, water-soluble nylon/methyl vinyl ether-maleic anhydride copolymer, water-soluble nylon/polyacrylamide, water-soluble nylon/polyethylene oxide, water-soluble nylon/sodium polyacrylate, and water-soluble nylon/-saponified polyvinyl acetate.

The mixing ratio of the water-soluble polymers in these polymer mixtures is not particularly critical, and where the mixing ratio of one water-soluble polymer is low, to manifest the properties of this polymer, the amount mixed of this water-soluble polymer should be at least 1% by weight based on the total solids of the water-soluble polymer mixture.

As the monomer having a reactive unsaturated group, that can be used in the present invention, there can be mentioned alkyl esters of acrylic acid such as methyl acrylate, ethyl acrylate, butyl acrylate and 2-ethylhexyl acrylate, alkyl esters of methacrylic acid such as methyl methacrylate and butyl methacrylate, and glycidyl acrylate, glycidyl methacrylate, allyl acrylate, allyl methacrylate, acrylic acid, methacrylic acid, itaconic acid, acrylamide, methacrylamide, dimethylaminoethyl acrylate, diethylaminoethyl methacrylate, hydroxymethyl acrylate, hydroxybutyl methacrylate, N-methylolacrylamide, N-methylolmethacrylamide, acrylonitrile, methacrylonitrile, styrene, α-methylstyrene, vinyl acetate, vinyltoluene, vinylpyridine, butadiene, isoprene, chloroprene, acrylurethane oligomer, polyethylene glycol diacrylate, polyethylene glycol dimethacrylate, polypropylene glycol diacrylate, polypropylene glycol dimethacrylate, 1,6-hexanediol diacrylate, neopentyl glycol diacrylate, 2,2-bis[4-(acryloxy-polyethoxy)phenyl]propane, 2-hydroxy-1-acryloxy-3-methacryloxypropane, 1,3-butyleneglycol dimethacrylate, 1,6-hexanediol methacrylate, neopentyl glycol dimethacrylate, 2,2-bis[4-methacryloxy-polyethoxy)phenyl]propane, trimethylolpropane trimethacrylate, tetramethylolmethane triacrylate and tetramethylolmethane tetraacrylate. These monomers can be used alone or in the form of mixtures of two or more thereof.

As the polymerization initiator that can be used, there can be mentioned, for example, peroxides such as benzoyl peroxide, cumene hydroperoxide and hydrogen peroxide, azo compounds such as azobisisobutyronitrile, persulfate compounds such as ammonium persulfate and potassium persulfate, perchloric acid compounds, and redox catalysts such as a combination of a persulfate compound and a reducing sulfoxy compound and a combination of a perchloric acid compound and a reducing sulfoxy compound.

The weight ratio of the solids of the incompatible water-soluble polymers to the monomer having a reactive unsaturated group is preferably in the range of from 95/5 to 3/97, most preferably from 90/10 to 15/85.

In the present invention, for example, a water-soluble polymer having a reactive unsaturated group or a thiol group, as disclosed in Japanese Examined Patent Publication No. 44-25794, also can be used as a protecting group. Furthermore, at least one other water-soluble polymer can be added to the incompatible water-soluble polymers to form a protecting colloid.

In this case, presumably because the grafting efficiency of the water-soluble polymer having a reactive unsaturated group or a thiol group as the protecting colloid with the polymerizable monomer is higher than the grafting efficiency of the water-soluble polymer free of a reactive unsaturated group or a thiol group as the protecting colloid with the polymerizable monomer, a better compatibility is obtained when the water-soluble polymer having a reactive unsaturated group or a thiol group is used as the protecting group. As the compound having a reactive unsaturated group, there can be mentioned, for example, acrylic acid, methacrylic acid, N-methylolacrylamide, N-methylolmethacrylamide, and compounds represented by the following general formula (I), which are disclosed in Japanese Examined Patent Publication No. 63-50344:

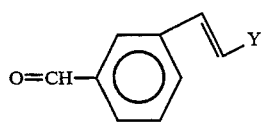
(I)

wherein Y represents a member selected from groups represented by the following general formulae (II) and (III):

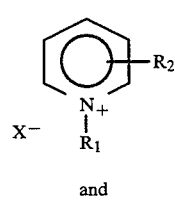
(II)

and

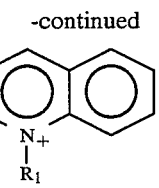
(III)

in which $R_1$ represents a member selected from a hydrogen atom, an alkyl group and an aralkyl group, with the proviso that said alkyl and aralkyl groups may have or may not have at least one member selected from a hydroxyl group, a carbamoyl group, an ether bond and an unsaturated bond, $R_2$ represents a member selected from a hydrogen atom and a lower alkyl group, and $X^-$ represents an anion.

A water-soluble polymer having a reactive unsaturated group can be obtained by addition-condensation of 0.005 to 50 parts by weight, preferably 0.05 to 5 parts by weight, of a reactive unsaturated group as mentioned above to 100 parts by weight of a water-soluble polymer such as saponified polyvinyl acetate, water-soluble nylon, gelatin, casein, collagen, starch, gum arabic, methyl cellulose or hydroxyethyl cellulose.

A thiol group-containing water-soluble polymer can be obtained by carrying out addition polymerization of a thiol group-containing compound such as 3-mercaptopropionic acid in the same manner as described above.

Furthermore, saponified polyvinyl acetate having a terminal thiol group can be obtained by polymerizing vinyl acetate in the presence of thiolacetic acid as a polymerization initiator or chain transfer agent and saponifying the obtained polymer.

If the water-soluble resin emulsion of the present invention is used, there can be obtained a photosensitive material for the production of a color filter, a material for silver salt photography and a photosensitive material for screen printing, which have an excellent coating property and mechanical strength. Furthermore, an overcoating agent, a prime-coating agent and an artificial leather material, which have excellent properties, can be obtained from the water-soluble resin emulsion of the present invention.

EXAMPLES

The present invention will now be described in detail with reference to the following examples and comparative examples.

Example 1

An emulsion polymerization was carried out according to customary procedures by using 500 g of a 10% aqueous solution of gelatin [jelly strength (6.66% aqueous solution) of 259 g, viscosity (6.66% aqueous solution of 42 mps and molecular weight of 100,000] and 500 g of a 10% aqueous solution of saponified polyvinyl acetate (polymerization degree of 1,800, saponification degree of 88 mole %) as the protecting colloid, 1 g of potassium persulfate as the heat polymerization initiator and 100 g of vinyl acetate as the monomer, whereby a water-soluble polyvinyl acetate emulsion comprising gelatin and saponified polyvinyl acetate as the protecting colloid was obtained.

In this emulsion, gelatin and saponified polyvinyl acetate were kept stably compatible with each other for a time as long as 1 month, and a film obtained by coating and drying the emulsion was uniform and transparent.

Comparative Example 1—1

First, 500 g of the same 10% aqueous solution of gelatin as used in Example 1 was mixed with 500 g of the same 10% aqueous solution of saponified polyvinyl acetate as used in Example 1. The liquid mixture was separated into a gelatin layer and a saponified polyvinyl acetate layer within 1 hour after the mixing. A film obtained by coating and drying the liquid mixture was uneven and opaque.

Comparative Example 1-2

500 g of the same 10% aqueous solution of gelatin as used in Example 1 and 500 g of the same 10% aqueous solution of saponified polyvinyl acetate as used in Example 1 were mixed with 300 g of a water-soluble polyvinyl acetate emulsion obtained by emulsion-polymerizing vinyl acetate in the presence of saponified polyvinyl acetate as the protecting colloid (solid concentration of 35%, polyvinyl acetate/saponified polyvinyl acetate weight ratio of 95/5).

Within several hours from the point of mixing, the liquid mixture was separated into a gelatin layer and a layer of a saponified polyvinyl acetate and a polyvinyl acetate emulsion. A film obtained by coating and drying the liquid mixture was uneven and opaque.

Example 2

The procedures of Example 1 were repeated in the same manner except that a 10% aqueous solution of water-soluble nylon (polymerization degree of 100) was used instead of the 10% aqueous solution of saponified polyvinyl acetate and butyl acrylate was used instead of vinyl acetate, whereby a water-soluble polybutyl acrylate emulsion comprising gelatin and water-soluble nylon as the protecting colloid was obtained.

In this emulsion, gelatin and nylon were kept stably compatible with each other for a long time, and film obtained by coating and drying this emulsion was uniform and transparent.

Comparative Example 2

The procedures of Comparative Example 1—1 were repeated in the same manner except that a 10% aqueous solution of water-soluble nylon (polymerization degree of 100) was used instead of the 10% aqueous solution of saponified polyvinyl acetate. The results were similar to those obtained in Comparative Example 1—1.

Example 3

The procedures of Example 1 were repeated in the same manner except that a 10% aqueous solution of water-soluble nylon (polymerization degree of 100) was used instead of the 10% aqueous solution of gelatin, azoisobutyronitrile was used instead of potassium persulfate and methyl methacrylate was used instaed of vinyl acetate. The results were similar to those obtained in Example 1.

Comparative Example 3

The procedure of Comparative Example 1-1 were repeated in the same manner except that a 10% aqueous solution of water-soluble nylon (polymerization degree of 100) was used instead of the 10% aqueous solution of gelatin. The results were similar to those obtained in Comparative Example 1—1.

Example 4

An emulsion polymerization was carried out according to customary procedures by using 700 g of a 10% aqueous solution of gelatin [jelly strength (6.66% aqueous solution) of 259 g, viscosity (6.66% aqueous solution) of 42 mps, molecular weight of 100,000] and 300 g of a 1% aqueous solution of polyacrylamide (molecular weight of 300,000) as the protecting colloid, 1 g of ammonium persulfate as the heat polymerization initiator and 100 g of vinyl acetate as the monomer. The results were similar to those obtained in Example 1.

Comparative Example 4

First, 700 g of the same 10% aqueous solution of gelatin as used in Example 4 was mixed with 300 g of the same 1% aqueous solution of polyacrylamide as used in Example 4. The results were similar to those obtained in Comparative Example 1—1.

Example 5

An emulsion polymerization was carried out according to customary procedures by using 400 g of a 10% aqueous solution of water-soluble nylon (polymerization degree of 100) and 600 g of a 10% aqueous solution of methyl cellulose (the viscosity of a 2% aqueous solution was 13 to 18 cps) as the protecting colloid, 1 g of benzoyl peroxide as the heat polymerization initiator and 100 g of methyl acrylate as the monomer. The results were similar to those obtained in Example 1.

Comparative Example 5

First, 400 g of the same 10% aqueous solution of water-soluble nylon as used in Example 5 was mixed with 600 g of the same 10% aqueous solution of methyl cellulose as used in Example 5. The results were similar to those obtained in Comparative Example 1—1.

Example 6

An emulsion polymerization was carried out according to customary procedures by using 600 g of a 10% aqueous solution of gelatin [jelly strength (6.66% aqueous solution) of 259 g, viscosity (6.66% aqueous solution) of 42 mps, molecular weight of 100,000] and 400 g of a 10% aqueous solution of sodium alginate (molecular weight of 15,000) as the protecting colloid, 1 g of ammonium persulfate as the heat polymerization initiator and 100 g of butyl acrylate as the monomer. The results were similar to those obtained in Example 1.

Comparative Example 6

First, 600 g of the same 10% aqueous solution of gelatin as used in Example 6 was mixed with 400 g of the same 10% aqueous solution of sodium alginate as used in Example 6. The results were similar to those obtained in Comparative Example 1—1.

Example 7

An emulsion polymerization was carried out according to customary procedures by using 600 g of a 10% aqueous solution of saponified polyvinyl acetate (polymerization degree of 1,800, saponification degree of 88 mole %) and 400 g of a 1% aqueous solution of polyacrylamide (molecular weight of 300,000) as the protecting colloid, 1 g of potassium persulfate as the heat polymerization initiator and 100 g of ethyl acrylate as the monomer. The results were similar to those obtained in Example 1.

Comparative Example 7

First, 600 g of the same 10% aqueous solution of saponified polyvinyl acetate as used in Example 7 was mixed with 400 g of the same 1% aqueous solution of polyacrylamide as used in Example 7. The results were similar to those obtained in Comparative Example 1—1.

Example 8

An emulsion polymerization was carried out according to customary procedures by using 600 g of a 10% aqueous solution of saponified polyvinyl acetate (polymerization degree of 1,800, saponification degree of 88 mole %) and 400 g of a 10% aqueous solution of dextrin as the protecting colloid, 1 g of azobisisobutyronitrile as the heat polymerization initiator and 100 g of vinyl acetate as the monomer. The results were similar to those obtained in Example 1.

Comparative Example 8

First, 600 g of the same 10% aqueous solution of saponified polyvinyl acetate as used in Example 8 was mixed with the same 10% aqueous solution of dextrin as used in Example 8. The results were similar to those obtained in Comparative Example 1—1.

Example 9

An emulsion polymerization was carried out according to customary procedures by using 500 g of a 10% aqueous solution of hydroxypropyl cellulose [viscosity (2% aqueous solution) of 7.85 cps] and 500 g of a 10% aqueous solution of water-soluble nylon (polymerization degree of 100) as the protecting colloid, 1 g of benzoyl peroxide as the heat polymerization initiator and 100 g of vinyl acetate as the monomer. The results were similar to those obtained in Example 1.

Comparative Example 9

First, 500 g of the same 10% aqueous solution of hydroxypropyl cellulose as used in Example 9 was mixed with 500 g of the same 10% aqueous solution of water-soluble nylon as used in Example 9. The results were similar to those obtained in Comparative Example 1—1.

Example 10

An emulsion polymerization was carried out according to customary procedures by using 500 g of a 10% aqueous solution of a gelatin derivative obtained by addition-condensing 3 parts of N-methylolacrylamide to 100 parts of the same gelatin as used in Example 1 according to customary procedures and 500 g of a 10% aqueous solution of a saponified polyvinyl acetate derivative obtained by addition-condensing 3 parts of N-methyl-4-(p-formylstyryl)-pyridinium-methosulfate to 100 parts of the same saponified polyvinyl acetate as used in Example 1 as the protecting colloid, 1 g of potassium persulfate as the polymerization initiator and 100 g of vinyl acetate as the monomer, whereby a water-soluble polyvinyl acetate emulsion comprising, as the protecting colloid, the gelatin derivative and the saponified polyvinyl acetate derivative was obtained.

In this emulsion, the gelatin derivative and the saponified polyvinyl acetate derivative were kept stably compatible with each other for a time as long as 1 month. A film obtained by coating and drying this emulsion was uniform and transparent, and the transparency was a little higher than that of the film obtained in Example 1.

Comparative Example 10

First, 500 g of the same 10% aqueous solution of the gelatin derivative as used in Example 10 was mixed with 500 g of the same 10% aqueous solution of the saponified polyvinyl acetate derivative. Within 1 hour from the point of mixing, the liquid mixture was separated into a layer of the gelatin derivative and a layer of the saponified polyvinyl acetate derivative. A film obtained by coating and drying the liquid mixture was uneven and opaque.

Example 11

An emulsion polymerization was carried out according to customary procedures by using 500 g of the same 10% aqueous solution of the gelatin derivative as used in Example 10 and 500 g of a 10% aqueous solution of a water-soluble nylon derivative obtained by addition-condensing 10 parts of acrylic acid to 100 parts by weight of the same water-soluble nylon as used in Example 2 as the protecting colloid, 1 g of potassium persulfate as the polymerization initiator and 100 g of butyl acrylate as the monomer, whereby a water-soluble polybutyl acrylate emulsion comprising, as the protecting colloid, the gelatin derivative and the water-soluble nylon derivative was obtained.

In this emulsion, the gelatin derivative and the water-soluble nylon derivative were stably compatible with each other for a time as long as 1 month. A film obtained by coating and drying this emulsion was uniform and transparent, and the 5 transparency of the film was a little higher than that of the film obtained in Example 2.

Comparative Example 11

First, 500 g of the same 10% aqueous solution of the gelatin derivative as used in Example 11 was mixed with 500 g of the same 10% aqueous solution of the water-soluble nylon derivative as used in Example 11. The results were similar to those obtained in Comparative Example 10.

Example 12

An emulsion polymerization was carried out according to customary procedures by using, as the protecting colloid, 500 g of the same 10% aqueous solution of the saponified polyvinyl acetate derivative as used in Example 10 and 500 g of the same 10% aqueous solution of the water-soluble nylon derivative as used in Example 11, 1 g of azobisisobutyronitrile as the polymerization initiator and 100 g of methyl methacrylate as the monomer, whereby a water-soluble polymethyl methacrylate emulsion comprising the saponified polyvinyl acetate derivative and the water-soluble nylon derivative as the protecting colloid was obtained.

In this emulsion, the saponified polyvinyl acetate derivative and the water-soluble nylon derivative were kept stably compatible with each other for a time as long as 1 month. A film obtained by coating and drying this emulsion was uniform and transparent, and the transparency of the film was a little higher than that of the film obtained in Example 3.

Comparative Example 12

First, 500 g of the same 10% aqueous solution of the saponified polyvinyl acetate derivative as used in Example 10 was mixed with 500 g of the same 10% aqueous solution of the water-soluble nylon derivative as used in Example 11. The obtained results were similar to those obtained in Comparative Example 10.

Example 13

According to customary procedures, 1100 g of the same polyvinyl acetate emulsion comprising gelatin and saponified polyvinyl acetate, as obtained in Example 1, and 10 g of N-methyl-4-(p-formylstyryl)pyridinium methosulfate, were subjected to addition condensation reaction. The obtained water-soluble emulsion was coated in a film thickness of 15 on a glass sheet and was then dried. A negative film was overlapped on the obtained film, and the assembly was irradiated with rays from a super-high pressure mercury lamp of 2 KW from a height of 1 m for 2 minutes. By this irradiation, the exposed area of the film was light-crosslinked and was rendered water-soluble, while the unexposed area was kept water-soluble.

Comparative Example 13-1

According to customary procedures, 500 g of the same 10% aqueous solution of gelatin as used in Example 1 and 10 g of N-methyl-4-(p-formylstyryl)-pyridinium methosulfate were subjected to addition condensation reaction. The obtained aqueous solution of gelatin was coated in a film thickness of 20 on a glass sheet and was then dried. A negative film was overlapped on the obtained film, and the assembly was irradiated with rays of a super-high pressure mercury lamp of 2 KW from a height of 1 m for 2 minutes. After the irradiation, both the exposed area and unexposed area were water-soluble, because addition condensation reaction does not occur between N-methyl-4-(p-formylstyryl)pyridinium methosulfate and gelatin.

Comparative Example 13-2

In a liquid mixture comprising 500 g of the same 10% aqueous solution of gelatin as used in Comparative Example 1 and 500 g of the same 10% aqueous solution of saponified polyvinyl acetate as used in Comparative Example 1 was dissolved 10 g of N-methyl-4-(p-formylstyryl)pyridinium methosulfate, and addition condensation reaction was carried out according to customary procedures. The obtained aqueous solution was coated in a thickness of 20μ on a glass sheet and was then dried. A negative film was overlapped on the obtained film and the assembly was irradiated with rays of a super-high pressure mercury lamp of 2 KW from a height of 1 m for 2 minutes. After the irradiation, a development with water was carried out. Since gelatin of the exposed area was not light-crosslinked, the film was eluted with water and the light crosslinking degree of the image area was insufficient. Accordingly, the film of the image area was peeled from the glass sheet and washed away.

when an emulsion obtained by polymerizing a monomer having a reactive unsaturated group by using a water-soluble polymer in which introduction of a light-crosslinkable photosensitive group such as a stilbazolium salt is difficult and another water-soluble polymer in which introduction of such a group as mentioned above is easy, as the protecting colloid, is reacted with a stilbazolium salt or the like according to customary procedures, the stilbazolium salt is introduced into the water-soluble polymer in which the introduction is easy, and the water-soluble polymer in which the introduction is difficult and the water-soluble polymer in which the introduction is easy are grafted to particles of the polymer obtained by the polymerization. Accordingly, the above-mentioned two water-soluble polymers are integrated with each other through the polymer particles.

From the foregoing description, it is understood that, according to the present invention, even a water-soluble polymer in which a light-crosslinkable photosensitive group such as a stilbazolium salt is very difficult can be used as a photosensitive material.

We claim:

1. A water-soluble resin emulsion comprising at least two incompatible water-soluble polymers, wherein at least one of said water-soluble polymers has a thiol group or a reactive unsaturated group derived from a compound selected from the group consisting of acrylic acid, methacrylic acid, N-methylolacrylamide, N-methylolmethacrylamide, and compounds represented by the following formula (I),

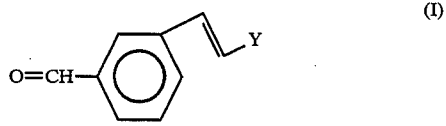

in which Y is represented by the following formulae (II) or (III):

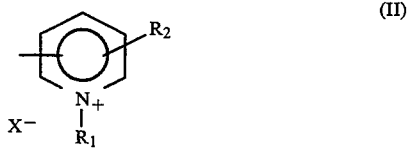

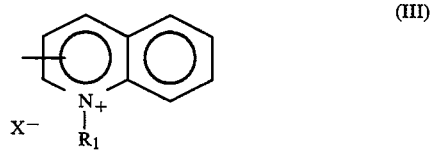

in which $R_1$ represents a member selected from a hydrogen atom, an alkyl group, aralkyl group, and alkyl and aralkyl groups having a hydroxyl group, a carbamoyl group, an ether group or an unsaturated bond, $R_2$ represents a member selected from a hydrogen atom and a lower alkyl group, and $X^-$ represents an anion, and wherein said incompatible water-soluble polymers are stably compatibilized with each other by emulsion-polymerizing a compound having at least one reactive unsaturated group in the presence of said incompatible water-soluble polymers as protecting colloid.

2. The water-soluble resin emulsion as set forth in claim 1, wherein one of the incompatible water-soluble polymer components is present in an amount of at least 1% by weight based on the total weight of the water-soluble polymer components.

3. The water-soluble resin emulsion as set forth in claim 1, wherein the ratio of the total weight of the incompatible water-soluble polymers to the weight of the compound having at least one reactive unsaturated group is 95:5 to 3:97.

4. The water-soluble resin emulsion as set forth in claim 1, wherein the compound having at least one reactive unsaturated group is selected from the group consisting of alkyl esters of acrylic acid, alkyl esters of methacrylic acid, glycidyl acrylate, glycidyl methacrylate, allyl acrylate, allyl methacrylate, acrylic acid, methacrylic acid, itaconic acid, acrylamide, methacrylamide, dimethylaminoethyl acrylate, diethylaminoethyl methacrylate, hydroxymethyl acrylate, hydroxybutyl methacrylate, N-methylolacrylamide, N-methylolmethacrylamide, acrylonitrile, methacrylonitrile, styrene, α-methylstyrene, vinyl acetate, vinyltoluene, vinylpyridine, butadiene, isoprene, chloroprene, acrylurethane oligomer, polyethylene glycol diacrylate, polyethylene glycol dimethacrylate, polypropylene glycol diacrylate, polypropylene glycol dimethacrylate, 1,6-hexanediol diacrylate, neopentyl glycol diacrylate, 2,2-bis[4-(acryloxy-polyethoxy)phenyl]propane, 2-hydroxy-1-acryloxy-3-methacryloxypropane, 1,3-butyleneglycol dimethacrylate, 1.6-hexanediol methacrylate, neopentyl glycol dimethacrylate, 2,2-bis[4-(methacryloxy-polyethoxy)phenyl]propane, trimethylolpropane trimethacrylate, tetramethylolmethane triacrylate and tetramethylolmethane tetraacrylate.

5. A process for the preparation of a water-soluble resin emulsion as defined in claim 1, which comprises emulsion-polymerizing a compound having a reactive unsaturated group in the presence of a protecting colloid of at least two incompatible water-soluble polymers wherein at least one of said water-soluble polymers has a thiol group or a reactive unsaturated group derived from a compound selected from the group consisting of, acrylic acid, methacrylic acid, N-methylolacrylamide, N-methylolmethacrylamide, and compounds represented by the following formula (I),

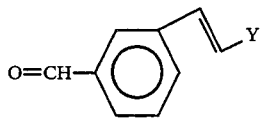

(I)

in which Y is represented by the following formulae (II) or (III):

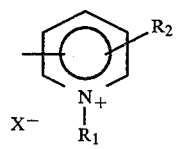

(II)

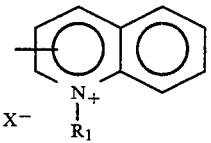

(III)

in which $R_1$ represents a member selected from a hydrogen atom, an alkyl group, an aralkyl group, and alkyl and aralkyl groups having a hydroxyl group, a carbamoyl group, an ether group or an unsaturated bond, $R_2$ represents a member selected from a hydrogen atom and a lower alkyl group, and $X_-$ represents an anion.

6. The process as set forth in claim 5, wherein one of the incompatible water-soluble polymers is present in an amount of at least 1% by weight based on the total weight of the water-soluble polymers.

7. The process as set forth in claim 5, wherein the ratio of the total weight of the incompatible water-soluble polymers to the weight of the compound having at least one reactive unsaturated group is 95:5 to 3:97.

8. The process as set forth in claim 5, wherein the compound having at least one reactive unsaturated group is selected from the group consisting of alkyl esters of acrylic acid, alkyl esters of methacrylic acid, glycidyl acrylate, glycidyl methacrylate, allyl acrylate, allyl methacrylate, acrylic acid, methacrylic acid, itaconic acid, acrylamide, methacrylamide, dimethylaminoethyl acrylate, diethylaminoethyl methacrylate, hydroxymethyl acrylate, hydroxybutyl methacrylate, N-methylolacrylamide, N-methylolmethacrylamide, acrylonitrile, methacrylonitrile, styrene, α-methylstyrene, vinyl acetate, vinyltoluene, vinylpyridine, butadiene, isoprene, chloroprene, acrylurethane oligomer, polyethylene glycol diacrylate, polyethylene glycol dimethacrylate, polypropylene glycol diacrylate, polypropylene glycol dimethacrylate, 1,6-hexanediol diacrylate, neopentyl glycol diacrylate, 2,2-bis[4-(acryloxypolyethoxy)phenyl]propane, 2-hydroxy-1-acryloxy-3-methacryloxypropane, 1,3-butyleneglycol dimethacrylate, 1,6-hexanediol methacrylate, neopentyl glycol dimethacrylate, 2,2-bis[4-(methacryloxy-polyethoxy)phenyl]propane, trimethylolpropane trimethacrylate, tetramethylolmethane triacrylate and tetramethylolmethane tetraacrylate.

* * * * *

UNITED STATES PATENT AND TRADEMARK OFFICE
CERTIFICATE OF CORRECTION

PATENT NO. : 5,360,860
DATED : NOVEMBER 1, 1994
INVENTOR(S) : HIROSHI ITOH, NAOKI ISOBE AND TADASHI ASAZUMA

It is certified that error appears in the above-identified patent and that said Letters Patent is hereby corrected as shown below:

Column 2, lines 35-36, "gelatin-carragee-nan" should read
-- gelatin/k-carrageenan, --

Column 8, line 31, delete "5";

Column 9, line 11, "15" should read --15 $\mu$ --;

Column 9, line 26, "20" should read -- 20 $\mu$ --; and

IN THE CLAIMS:

Column 11, line 15, "1.6" should read -- 1,6 --; and

Column 12, line 15, "X_" should read -- X⁻ --.

Signed and Sealed this

Nineteenth Day of August, 1997

*Attest:*

BRUCE LEHMAN

*Attesting Officer*     Commissioner of Patents and Trademarks